United States Patent
Zhong et al.

(10) Patent No.: US 7,221,046 B2
(45) Date of Patent: May 22, 2007

(54) SYSTEM TO CONTROL EFFECTIVE SERIES RESISTANCE OF POWER DELIVERY CIRCUIT

(75) Inventors: Dong Zhong, San Jose, CA (US); David G. Figueroa, Tolleson, AZ (US); Yuan-Liang Li, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 204 days.

(21) Appl. No.: 10/970,237

(22) Filed: Oct. 21, 2004

(65) Prior Publication Data

US 2006/0087012 A1    Apr. 27, 2006

(51) Int. Cl.
*H01L 23/02* (2006.01)
(52) U.S. Cl. .................. 257/678; 257/704; 438/106
(58) Field of Classification Search ............ 257/678, 257/704; 438/106, 121, 125
See application file for complete search history.

(56) References Cited

U.S. PATENT DOCUMENTS

| | | | | |
|---|---|---|---|---|
| 4,714,981 A | * | 12/1987 | Gordon | 361/783 |
| 5,272,590 A | * | 12/1993 | Hernandez | 361/306.2 |
| 6,449,166 B1 | * | 9/2002 | Sly et al. | 361/760 |
| 6,806,569 B2 | * | 10/2004 | Breisch et al. | 257/728 |

* cited by examiner

*Primary Examiner*—Roy Karl Potter
(74) *Attorney, Agent, or Firm*—Buckley, Maschoff & Talwalker LLC (57) ABSTRACT

According to some embodiments, a system includes an integrated circuit package to support an integrated circuit die. The integrated circuit package may include a plurality of conductive contacts, and an element having a plurality of resistive portions, each of the plurality of resistive portions being coupled to a respective one of the plurality of conductive contacts. The integrated circuit package may further include a decoupling capacitor having a plurality of capacitor pads, each of the plurality of capacitor pads being coupled to a respective one of the plurality of resistive portions.

15 Claims, 7 Drawing Sheets

SYSTEM TO CONTROL EFFECTIVE SERIES RESISTANCE OF POWER DELIVERY CIRCUIT

BACKGROUND

An integrated circuit package may provide physical protection to an integrated circuit die, dissipate heat generated by the integrated circuit die, and electrically connect the integrated circuit die to external circuitry. In the latter regard, a conventional integrated circuit package may provide power and ground planes for distributing and routing power signals between the integrated circuit die and a motherboard. The transmission of these signals often results in unwanted resonance between the motherboard and the integrated circuit package, which may negatively affect the performance of the integrated circuit die.

DETAILED DESCRIPTION

Figure 1:
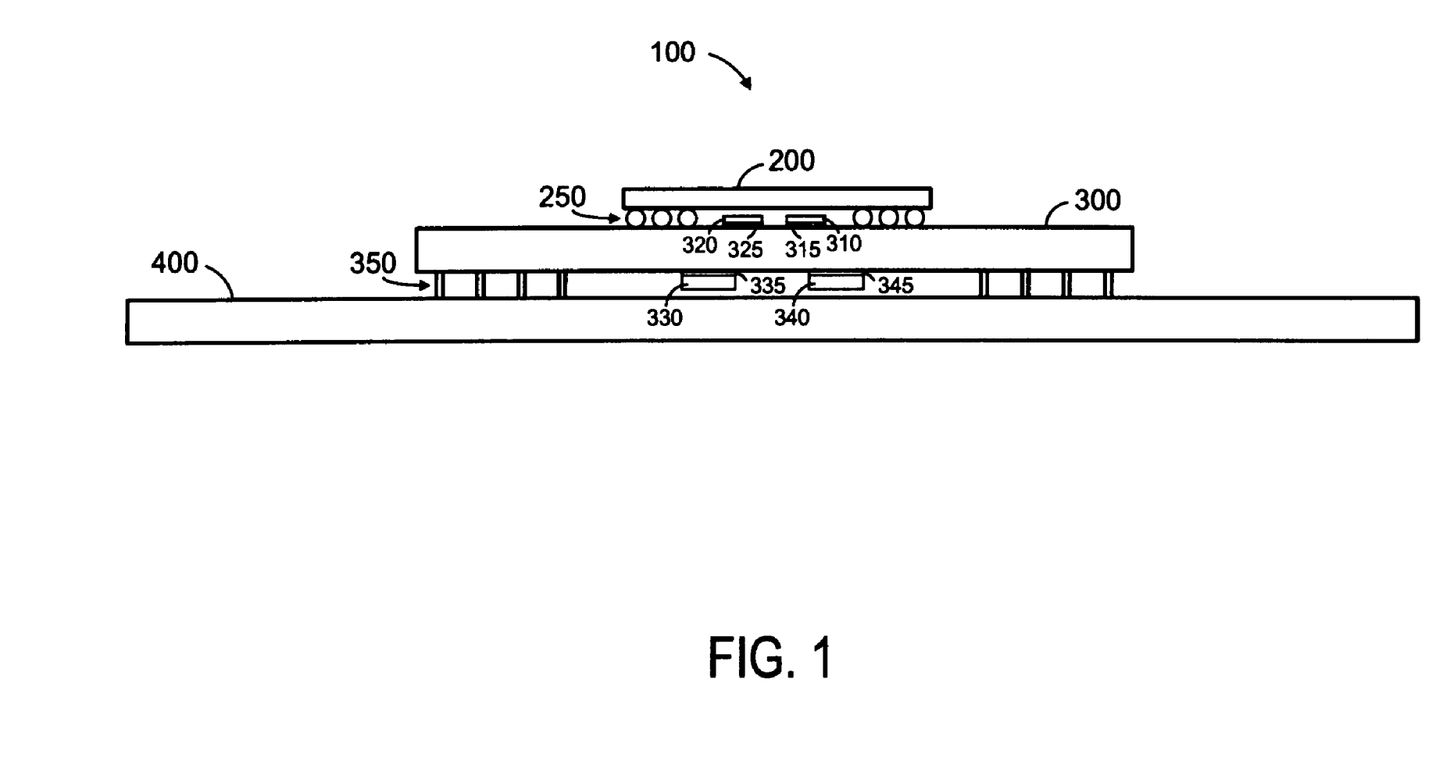
FIG. 1 is a cutaway side elevation of a system according to some embodiments.

FIG. 1 is a side elevation of system 100 according to some embodiments. System 100 includes integrated circuit die 200, integrated circuit package 300, and motherboard 400. Integrated circuit die 200 may be fabricated using any suitable substrate material and fabrication technique and may provide any functions to system 100. In some embodiments, integrated circuit die 200 is a microprocessor die having a silicon substrate.

Integrated circuit package 300 may comprise any ceramic, organic, and/or other suitable material. Package 300 is electrically coupled to circuit elements of die 200 by Controlled Collapse Chip Connect (C4) solder bumps 250. In some embodiments, integrated circuit package 300 is electrically coupled to circuit 200 via wirebonds.

Decoupling capacitors 310 through 340 are coupled to integrated circuit package 300. Disposed between capacitors 310 through 340 are respective ones of elements 315, 325, 335 and 345. As will be described in detail below, resistive portions of each of elements 315, 325, 335 and 345 are coupled to respective capacitor pads of capacitors 310 through 340 and to respective conductive contacts of integrated circuit package 300. Such an arrangement may provide control over the equivalent series resistance of each of capacitors 310 through 340. Some embodiments of the foregoing may reduce resonance between package 300 and motherboard 400 more effectively and/or more efficiently than conventional systems.

Pins 350 couple package 300 to motherboard 400. Pins 350 may carry power and other electrical signals between motherboard 400 and die 200. In some embodiments, pins 350 interface with a socket (not shown) of motherboard 400. According to some embodiments, integrated circuit package 300 is a surface-mountable substrate such as an Organic Land Grid Array substrate that may be mounted directly on motherboard 400 or mounted on a pinned interposer which mates with a socket of motherboard 400. Packaging systems other than those mentioned above may be used in conjunction with some embodiments.

Figure 2:
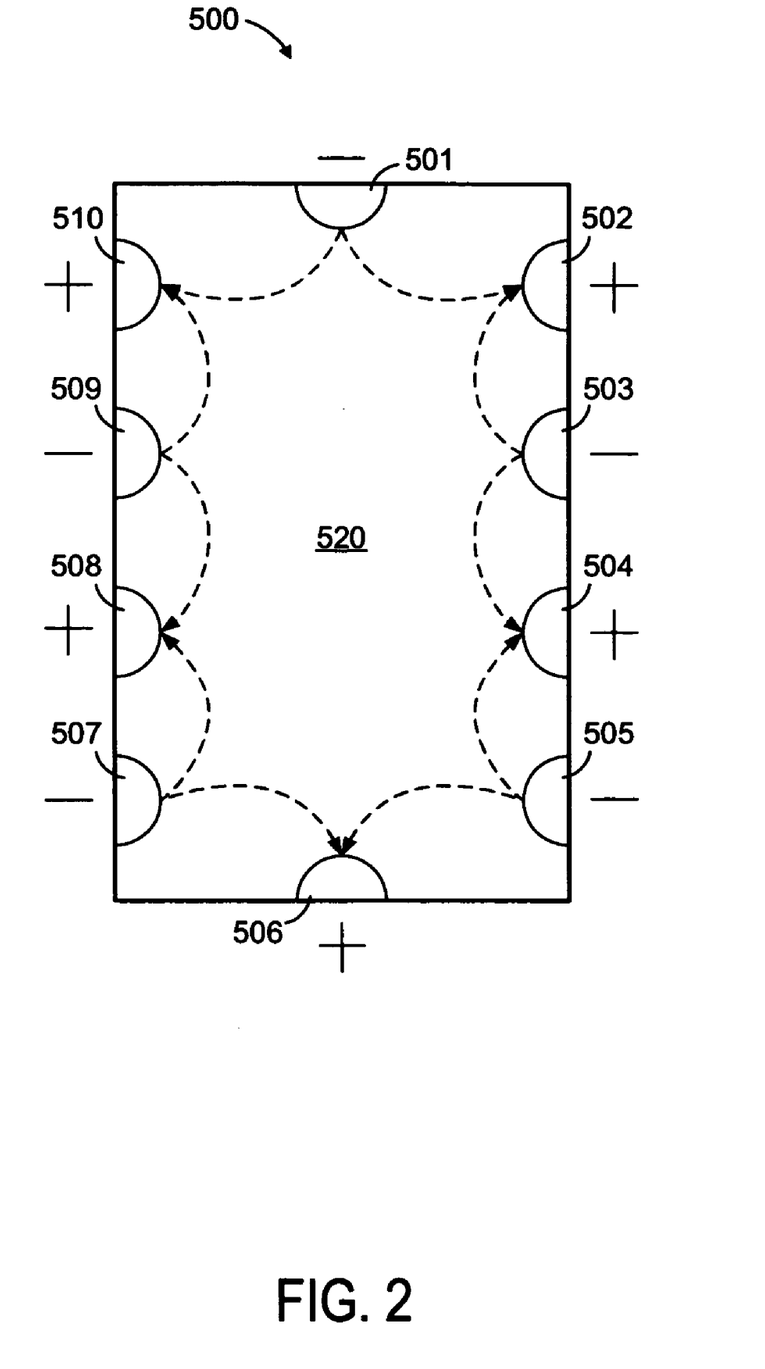
FIG. 2 is a top view of an element comprising a plurality of resistive portions according to some embodiments.

FIG. 2 is a top view of resistive element 500 according to some embodiments. Element 500 may represent one or more of elements 315, 325, 335 and 345 of FIG. 1.

Element 500 comprises resistive portions 501 through 510 and substantially non-conductive portion 520. Portion 520 electrically isolates each of resistive portions 501 through 510 from each other of resistive portions 501 through 510. Resistive portions 510 through 510 may comprise and material exhibiting a resistance that is suitable for the particular application in which element 500 is to be employed. Similarly, substantially non-conductive portion 520 may comprise any one or more materials that are substantially non-conductive in view of the voltage and current levels of the particular application.

In some embodiments, resistive portions 501 through 510 comprise a resistive polymer and portion 520 also comprises a polymer. Such embodiments may facilitate the manufacturing of element 500. For example, element 500 may be manufactured as a sheet of non-conductive polymer. The sheet may be treated at locations corresponding to the locations of portions 501 through 510 in order to produce a material having an appropriate resistivity at the locations. Many elements 500 may be manufactured on a single sheet and then separated.

The dashed arrows of FIG. 2 illustrate current flow between resistive portions 501 through 510. Current may flow as indicated in a case that element 500 is coupled to pads of a capacitor and to conductive contacts of an integrated circuit package as described below. In this regard, the number, location and size of resistive portions 501 through 510 is not limited to that shown in FIG. 2. The number, size and location, as well as the shape of element 500, may vary to correspond to the pads of the capacitor and the conductive contacts of the integrated circuit package to which element 500 is to be coupled. Moreover, the composition and dimensions of each of resistive portions 501 through 510 may be controlled to provide a desired equivalent series resistance to the circuit to which element 500 is to be coupled.

Figure 3:
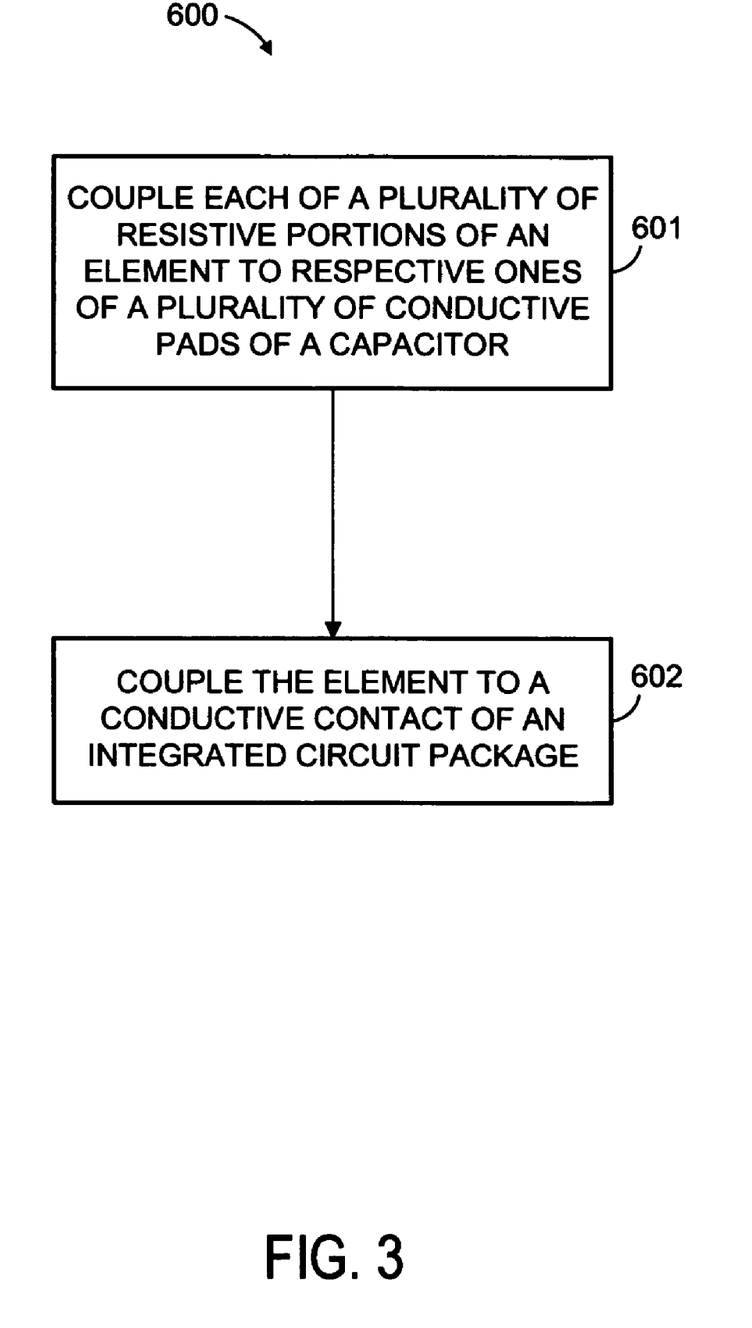
FIG. 3 is a flow diagram of a method according to some embodiments.

FIG. 3 is a flow diagram of a method according to some embodiments. Method 600 may be executed by any combination of hardware, software and/or firmware, and some or all of method 600 may be performed manually. Portions of method 600 may be performed by different entities. For example, method 600 may be performed by any combination of an integrated circuit manufacturer, a capacitor manufacturer, and a system integrator.

Figure 4:
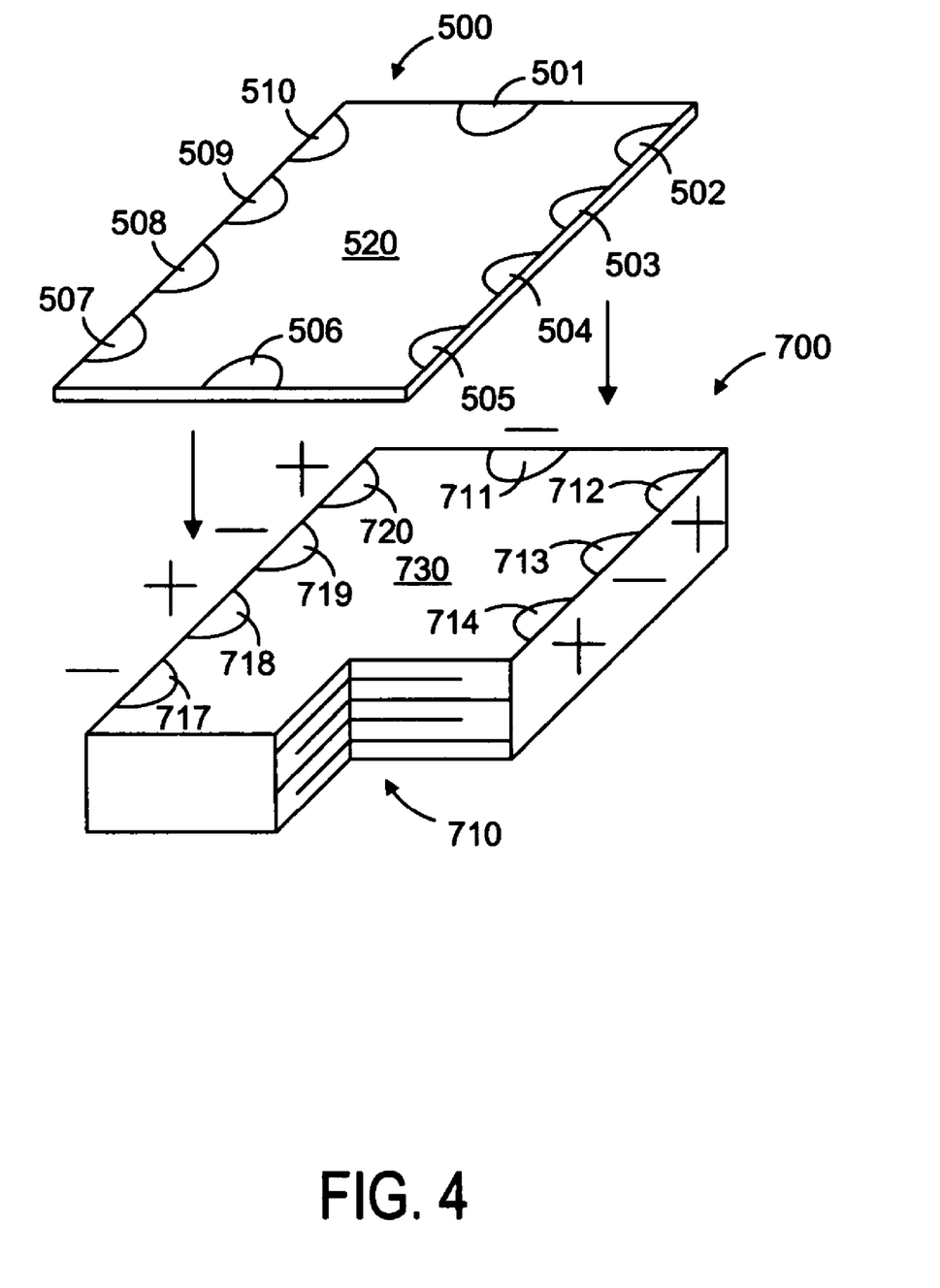
FIG. 4 includes a cutaway view of a capacitor and a perspective view of an element comprising a plurality of resistive portions according to some embodiments.

Initially, at 601, a plurality of resistive portions of an element are coupled to respective ones of a plurality of conductive pads of a capacitor. FIG. 4 illustrates some embodiments of 601. FIG. 4 includes a perspective view of element 500 and a cutaway perspective view of interdigitated capacitor 700. Capacitor 700 comprises several positive and negative terminal plates that are alternately stacked and separated by a dielectric. The negative plates are electrically coupled to negative capacitor pads 711, 713, 715 (not shown), 717 and 719, while the positive plates are electrically coupled to positive capacitor pads 712, 714, 716 (not shown), 718 and 720. This arrangement may provide a lower equivalent series inductance than other arrangements.

Element 500 may be placed on capacitor 700 at 601 so as to align each of resistive portions 501 through 510 to a respective one of pads 711 through 720. Element 500 may be bonded to capacitor 700 using any suitable system that is or becomes known. Bonding element 500 to capacitor 700 may include bonding each of resistive portions 501 through 510 to the respective one of pads 711 through 720 and/or bonding substantially non-conductive portion 520 to body 730 of capacitor 700. Other types of capacitors including two terminal, non-interdigitated capacitors may be used in conjunction with some embodiments. As mentioned above, the number, size, location, composition and dimensions of resistive portions 501 through 510 and the shape of element 500 may vary to correspond to the pads of the particular capacitor being used.

Figure 5:
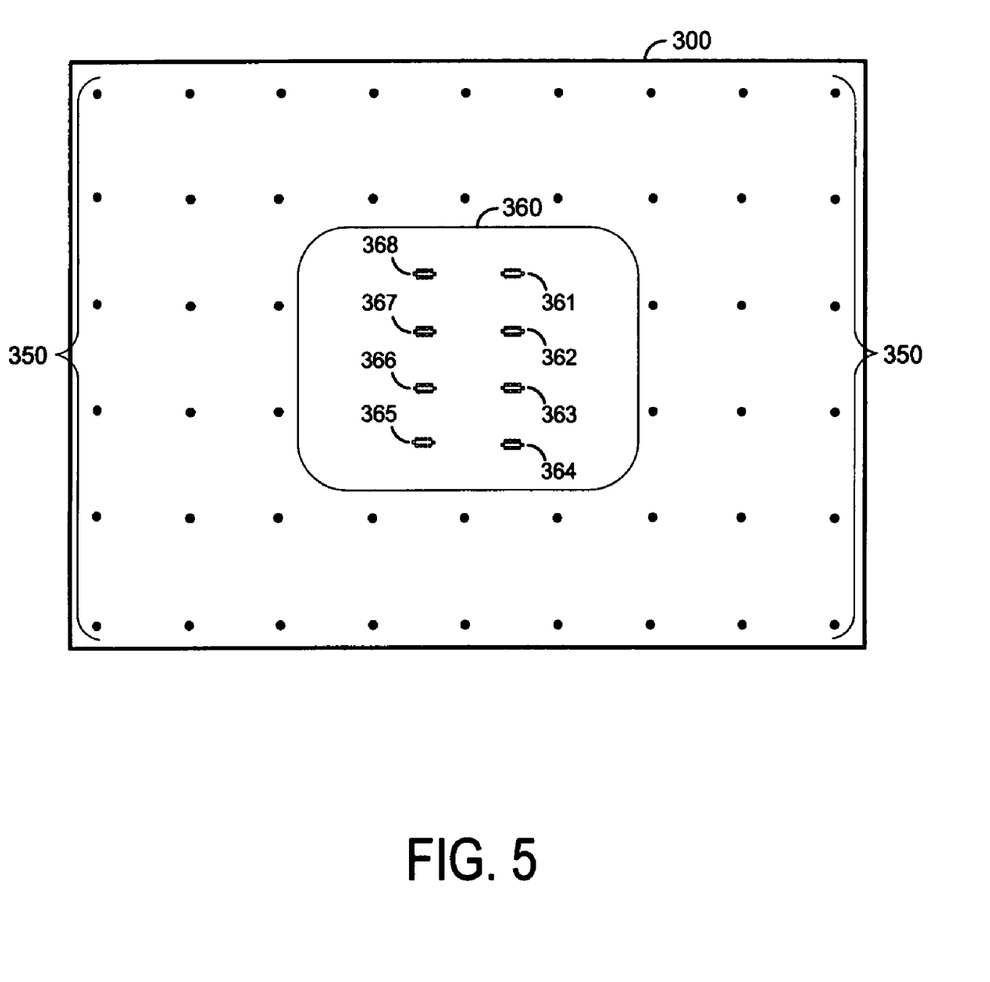
FIG. 5 is a bottom view of an integrated circuit package according to some embodiments.

Returning to method 600, the element is coupled to a conductive contact of an integrated circuit package at 602. FIG. 5 is a bottom view of integrated circuit package 300 according to some embodiments. Pins 350 are shown disposed around recess 360 defined by package 300, although any configuration of pins 350 may be used in conjunction with some embodiments.

Conductive contact sets 361 through 368 are disposed within recess 360. Each of conductive contact sets 361 through 368 comprises a plurality of conductive contacts to receive a decoupling capacitor. The conductive contacts of contact sets 361 through 370 may comprise any currently- or hereafter-known conductive contacts, including but not limited to gold and/or nickel-plated copper contacts fabricated upon integrated circuit package 300. Contact sets 361 through 368 may be recessed under, flush with, or extending above the illustrated surface of package 300. According to some embodiments, the conductive contacts are coupled to a power delivery circuit of package 300. Decoupling capacitors may be mounted in recess 360 to reduce resonance between integrated circuit package 300 and a board such as motherboard 400 on which integrated circuit package 300 is to be mounted.

Figure 6:
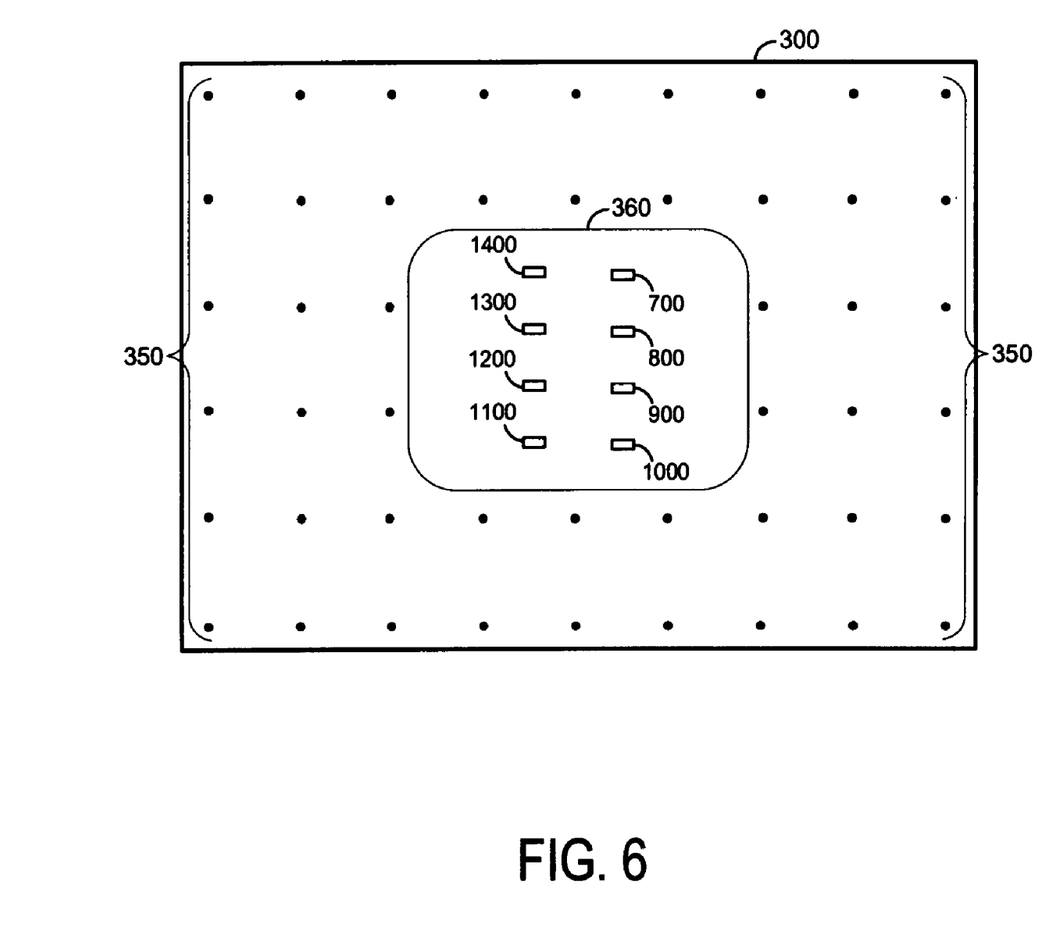
FIG. 6 is a bottom view of an integrated circuit package having capacitors coupled thereto according to some embodiments.

According to some embodiments of 62, each of resistive areas 501 through 510 of element 500 are coupled to a respective conductive contact of conductive contact set 361. The coupling may be accomplished using any suitable surface-mounting technology or other system. In some embodiments, one or more conductive contacts is coated with a conductive material such as solder paste and/or conductive epoxy prior to receiving a respective one of resistive areas 501 through 510. FIG. 6 is a bottom view of integrated circuit package 300 after 62 and according to some embodiments. FIG. 6 shows capacitors 700 through 1400 mounted onto respective ones of conductive contact sets 361 through 368.

Embodiments may differ from those described above. For example, some embodiments include coupling each of resistive portions 501 through 510 to respective ones of a plurality of conductive contacts of package 300, and then coupling capacitor 700 to element 500. Coupling capacitor 700 to element 500 may include coupling each of capacitor pads 711 through 720 to a respective one of resistive portions 501 through 510.

According to some embodiments, more than one element such as element 500 is disposed between capacitor 700 and integrated circuit package 300. In other words, elements such as element 500 may be stacked onto capacitor 700 (or package 300) to increase the equivalent series resistance of capacitor 700. The stacked elements and/or their resistive portions may present identical or different series resistances, and may differ in thickness, composition, shape, and/or size.

Figure 7:
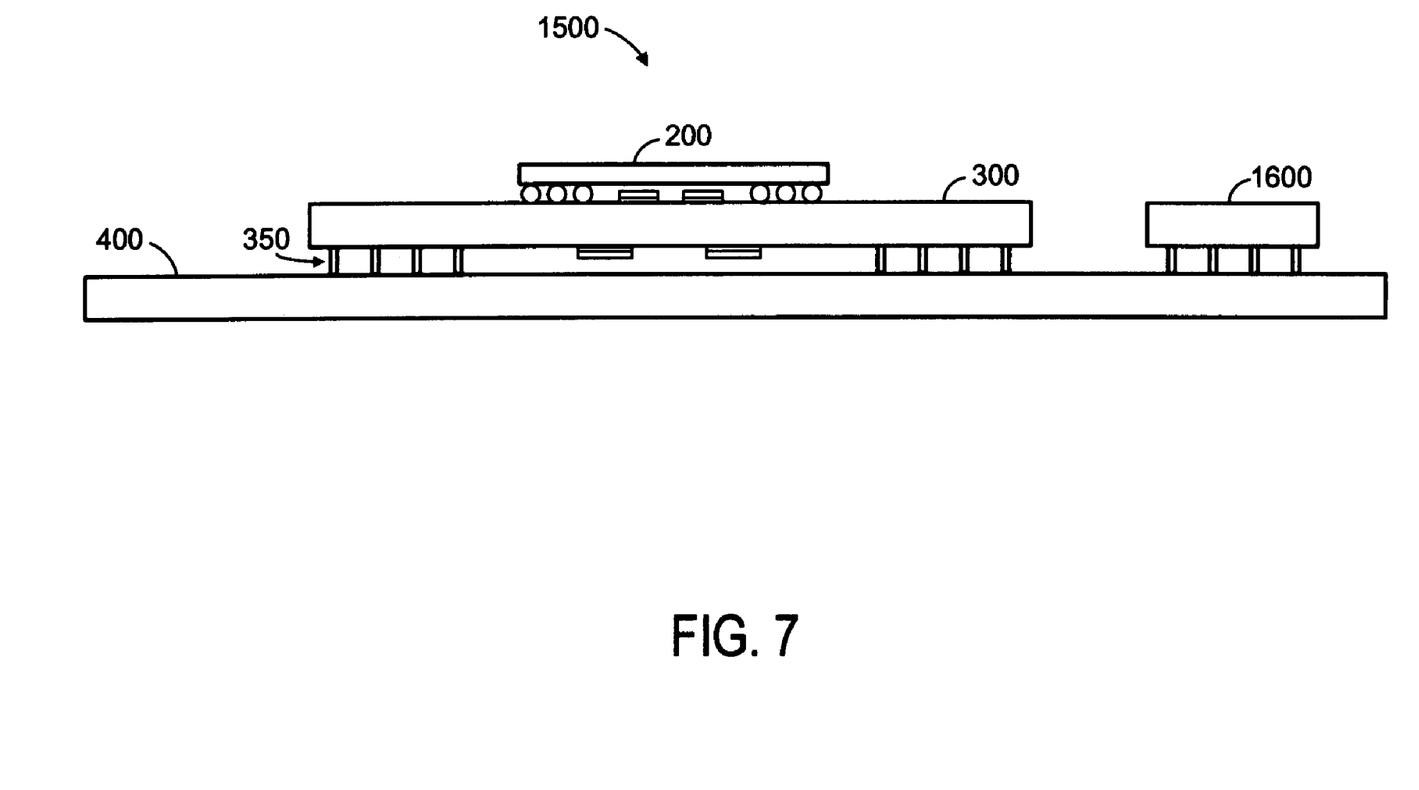
FIG. 7 is a cutaway side elevation of a system according to some embodiments.

FIG. 7 illustrates a system according to some embodiments. System 1500 includes system 100 of FIG. 1 and memory 1600. System 1500 may comprise components of a desktop computing platform. Memory 1600 and motherboard 400 may be electrically coupled to integrated circuit package 300 and integrated circuit die 200. More particularly, motherboard 400 may comprise a memory bus (not shown) coupled to pins 350 and to memory 1600. In operation, motherboard 400 may route input/output and power signals to pins 350 for transmission to integrated circuit die 200 through integrated circuit package 300. Memory 1600 may comprise any type of memory for storing data, such as a Single Data Rate Random Access Memory, a Double Data Rate Random Access Memory, or a Programmable Read Only Memory.

The several embodiments described herein are solely for the purpose of illustration. Embodiments may include any currently or hereafter-known versions of the elements described herein. Therefore, persons in the art will recognize from this description that other embodiments may be practiced with various modifications and alterations.

What is claimed is:

1. An apparatus comprising:
   an integrated circuit package comprising a plurality of conductive contacts to receive a decoupling capacitance; and
   an element comprising a plurality of resistive portions, and wherein each of the plurality of resistive portions is coupled to a respective one of the plurality of conductive contacts,
   wherein the element further comprises one or more nonconductive portions, the one or more nonconductive portions to electrically isolate each one of the plurality of resistive portions from each other one of the plurality of resistive portions, and
   wherein the plurality of resistive portions comprise a first polymer material and the one or more nonconductive portions comprise a second polymer material.

2. An apparatus according to claim 1, wherein the plurality of conductive contacts are electrically coupled to a power delivery circuit of the integrated circuit package.

3. An apparatus according to claim 1, further comprising:
   a second element comprising a second plurality of resistive portions,
   wherein each of the second plurality of resistive portions is coupled to a respective one of the plurality of resistive portions of the element.

4. An apparatus comprising:
   a decoupling capacitor comprising a plurality of capacitor pads; and
   an element comprising a plurality of resistive portions, and wherein each of the plurality of resistive portions is coupled to a respective one of the plurality of capacitor pads,
   wherein the element further comprises one or more nonconductive portions, the one or more nonconductive portions to electrically isolate each one of the plurality of resistive portions from each other one of the plurality of resistive portions, and
   wherein the plurality of resistive portions comprise a first polymer material and the one or more nonconductive portions comprise a second polymer material.

5. An apparatus according to claim 4, further comprising:
an integrated circuit package comprising a plurality of conductive contacts coupled to a power delivery circuit of the integrated circuit package, wherein each of the plurality of restive portions is coupled to a respective one of the plurality of conductive contacts.

6. An apparatus according to claim 4, further comprising:
a second element comprising a second plurality of resistive portions,
wherein each of the second plurality of resistive portions is coupled to a respective one of the plurality of resistive portions of the element.

7. A method comprising:
coupling each of a plurality of resistive portions of an element to respective ones of a plurality of conductive contacts of an integrated circuit package; and
after coupling each of the plurality of resistive portions of the element to the respective ones of the plurality of conductive contacts, coupling a capacitor pad of a decoupling capacitor to the element,
wherein the element comprises one or more nonconductive portions, the one or more nonconductive portions to electrically isolate each one of the plurality of resistive portions from each other one of the plurality of resistive portions, and
wherein the plurality of resistive portions comprise a first polymer material and the one or more nonconductive portions comprise a second polymer material.

8. A method according to claim 7, wherein coupling the capacitor pad to the element comprises coupling the capacitor pad to one of the plurality of resistive portions and coupling a second capacitor pad of the decoupling capacitor to a second one of the plurality of resistive portions.

9. A method comprising:
coupling each of a plurality of resistive portions of an element to respective ones of a plurality of conductive pads of a capacitor; and
after coupling the plurality of resistive portions to the respective ones of the plurality of conductive pads, coupling the element to a conductive contact of an integrated circuit package,
wherein the element comprises one or more nonconductive portions, the one or more nonconductive portions to electrically isolate each one of the plurality of resistive portions from each other one of the plurality of resistive portions, and
wherein the plurality of resistive portions comprise a first polymer material and the one or more nonconductive portions comprise a second polymer material.

10. A method according to claim 9, wherein coupling the element to the conductive contact comprises coupling the conductive contact to one of the plurality of resistive portions and coupling a second conductive contact of the integrated circuit package to a second one of the plurality of resistive portions.

11. A system comprising:
a microprocessor die;
an integrated circuit package coupled to the microprocessor die, the integrated circuit package comprising:
a plurality of conductive contacts:
an element comprising a plurality of resistive portions, and wherein each of the plurality of resistive portions is coupled to a respective one of the plurality of conductive contacts; and
a decoupling capacitor comprising a plurality of capacitor pads, each of the plurality of capacitor pads coupled to a respective one of the plurality of resistive portions; and
a double data rate memory coupled to the integrated circuit package.

12. A system according to claim 11, wherein the plurality of conductive contacts are coupled to a power delivery circuit of the integrated circuit package.

13. A system according to claim 11, wherein the element further comprises:
one or more nonconductive portions, the one or more nonconductive portions to electrically isolate each one of the plurality of resistive portions from each other one of the plurality of resistive portions.

14. A system according to claim 13, wherein the plurality of resistive portions comprise a first polymer material and the one or more nonconductive portions comprise a second polymer material.

15. A system according to claim 11, further comprising:
a motherboard coupled to the integrated circuit package and to the double data rate memory.

* * * * *